United States Patent

Mukai et al.

[11] Patent Number: 6,006,304
[45] Date of Patent: Dec. 21, 1999

[54] APPARATUS AND METHOD FOR CALCULATING AN ERASURE TIME FOR DATA STORED IN A FLASH MEMORY

[75] Inventors: Hirofumi Mukai, Kodaira; Kiyoshi Matsubara, Higashimurayama, both of Japan

[73] Assignee: Hitachi, Ltd., Tokyo, Japan

[21] Appl. No.: 08/603,211

[22] Filed: Feb. 20, 1996

Related U.S. Application Data

[63] Continuation of application No. 08/258,705, Jun. 13, 1994, abandoned.

[30] Foreign Application Priority Data

Jun. 25, 1993 [JP] Japan .................................... 5-154796

[51] Int. Cl.[6] .............................. G06F 9/44; G06F 15/78
[52] U.S. Cl. .................... 711/103; 711/102; 365/185.14; 365/185.29; 365/185.3; 365/185.33; 365/218; 395/800.37; 395/800.39
[58] Field of Search ..................................... 395/800, 430, 395/800.37, 800.39; 711/102–103; 365/185.29, 185.3, 185.33, 185.14, 218

[56] References Cited

U.S. PATENT DOCUMENTS

| | | | |
|---|---|---|---|
| 5,053,990 | 10/1991 | Kreifels et al. | 711/103 |
| 5,239,679 | 8/1993 | Murai | 455/38.1 |
| 5,245,572 | 9/1993 | Kosonocky et al. | 365/189.02 |
| 5,375,222 | 12/1994 | Robinson et al. | 395/430 |
| 5,446,904 | 8/1995 | Belt et al. | 395/750 |
| 5,581,503 | 12/1996 | Matsubara et al. | 365/185.33 |
| 5,687,345 | 11/1997 | Matsubara et al. | 711/103 |

FOREIGN PATENT DOCUMENTS 4145566  5/1992  Japan .

Primary Examiner—Tod R. Swann
Assistant Examiner—Denise Tran
Attorney, Agent, or Firm—Fay Sharpe Beall Fagan Minnich & McKee

[57] ABSTRACT

A system includes a microcomputer. The microcomputer includes a clock signal circuit, a measuring circuit, a central processing unit, and a flash memory. A user sets a frequency of a clock signal provided by the clock signal circuit. The measuring unit counts a number of cycles of the clock signal in a period specified by reference data. The central processing unit receives the clock signal from the clock signal circuit and operates in accordance with the clock signal. The flash memory stores data which is electrically erased during an erase operation. The erase operation is executed during an erase time which includes a number of cycles of the clock signal calculated by the central processing unit. The central processing unit calculates a time for one cycle of the clock signal as a function of the period specified by the reference data and the number of cycles counted by the measuring unit. The central processing unit then calculates the number of cycles of the clock signal to be allocated as the erase time as a function of the time for one cycle of the clock signal.

10 Claims, 12 Drawing Sheets

FIG. 5

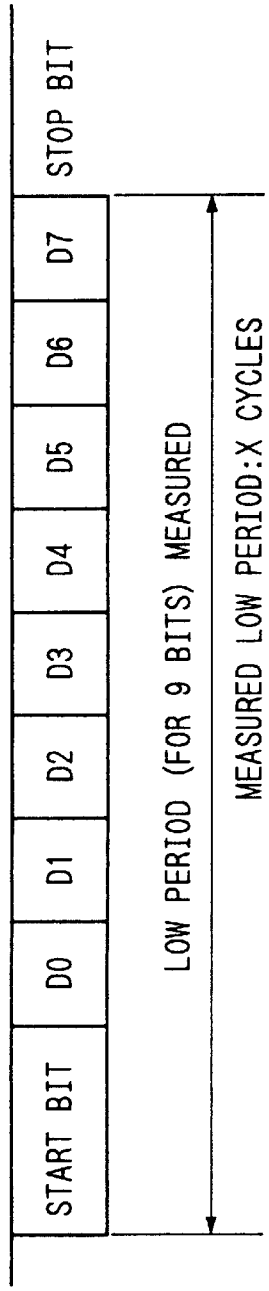

| START BIT | D0 | D1 | D2 | D3 | D4 | D5 | D6 | D7 | STOP BIT |

LOW PERIOD (FOR 9 BITS) MEASURED

MEASURED LOW PERIOD: X CYCLES

THE LOW PERIOD CYCLES ARE CONVERTED TO TIME USING THE FOLLOWING EXPRESSION:

$$X \times 2/OCS = 9 \times 1/B \quad \cdots (1)$$

WHERE, OCS STANDS FOR THE FREQUENCY OF MICROCOMPUTER OSCILLATION AND B FOR THE BAUD RATE (FOR START-STOP COMMUNICATION) THE TIME OF ONE CYCLE EQUALS 2/OCS

THE VALUE (N) OF THE SCI BIT RATE (IN WHICH TO SET THE BIT RATE) FOR THE MICROCOMPUTER IS CALCULATED USING THE EXPRESSION:

$$N = OSC/(64 \times B) - 1 \quad \cdots (2)$$

GIVEN THE RESULTS OF EXPRESSIONS (1) AND (2), EXPRESSION (3) BELOW IS USED TO FIND THE BAUD RATE VALUE TO BE SET IN THE SCI BIT REGISTER OF THE MICROCOMPUTER, THE VALUE REPRESENTING THE BAUD RATE THE SAME AS THAT OF THE DATA FROM THE HOST COMPUTER:

$$N = X/(9 \times 32) - 1 \quad \cdots (3)$$

CONTROL REGISTER CR

PROGRAM/ERASE CONTROL REGISTER

| VPP | | | | EV | PV | E | P |
|-----|--|--|--|----|----|---|---|

PROGRAM OPERATION

| MEMORY CELL | SELECTED/UNSELECTED | SOURCE | DRAIN | GATE |
|---|---|---|---|---|
| Q1 | SELECTED | 0v | 8v | 12v |
| Q2 | UNSELECTED | 0v | 0v | 12v |
| Q3 | UNSELECTED | 0v | 8v | 0v |
| Q4 | UNSELECTED | 0v | 0v | 0v |

ERASE OPERATION (BY POSITIVE VOLTAGE METHOD)

| MEMORY CELL | SELECTED/UNSELECTED | SOURCE | DRAIN | GATE |
|---|---|---|---|---|
| Q1, Q3 | SELECTED | 12v | 0v | 0v |
| Q2, Q4 | UNSELECTED | 0v | 0v | 0v |

ERASE OPERATION (BY NEGATIVE VOLTAGE METHOD)

| MEMORY CELL | SELECTED/UNSELECTED | SOURCE | DRAIN | GATE |
|---|---|---|---|---|
| Q1, Q2 | SELECTED | 5v | 0v | -10v |
| Q3, Q4 | UNSELECTED | 5v | 0v | 0v |

FIG. 8

APPARATUS AND METHOD FOR CALCULATING AN ERASURE TIME FOR DATA STORED IN A FLASH MEMORY

This application is a continuation application of U.S. Ser. No. 08/258,705, filed Jun. 13, 1994, now abandoned.

BACKGROUND OF THE INVENTION

The present invention relates to a microcomputer and, more particularly, to a microcomputer comprising a nonvolatile flash memory to and from which data may be written and erased electrically.

Illustratively, EPROM's are writable nonvolatile memories whose data is erased by use of ultraviolet rays. This means that these memories need to be detached from the systems incorporating them for the erasure and writing of data therefrom and thereto.

By contrast, flash memory EEPROM's have data written and erased thereto and therefrom electrically. It follows that these memories may remain installed in their respective systems while the memory data is being updated.

One means for updating data in the EEPROM's is a serial communication interface. In the typical serial communication setup, the baud rate on the host computer side is fixed while the baud rate of the microcomputer using the memory is determined by the operating frequency of the microcomputer. A suitable value representing the baud rate so determined is set in a register of the serial communication interface.

SUMMARY OF THE INVENTION

The above prior art setup involves the use of the serial communication interface in the microcomputer for communication with an externally located host computer. In that case, it is necessary to determine beforehand the baud rate of data transmission on the host computer side and to set the corresponding baud rate value in a register of the internal serial communication interface to comply with the baud rate requirements of the host computer. In addition, the setting in the register needs to be modified depending on the operating frequency of the microcomputer.

One disadvantage of the prior art is that the conventional start-stop transmission system based on the serial communication interface requires keeping the register value updated in accordance with the baud rate of the host computer for data transmission as well as with the operating frequency of the microcomputer. Another disadvantage is that the time required to update data in the flash memory of the microcomputer needs to be changed depending on the user-designated operating frequency of the microcomputer.

It is therefore an object of the present invention to provide a microcomputer capable of automatically setting the baud rate of its serial communication interface for start-stop transmission to a communicating party while the microcomputer remains installed in its system, so that the microcomputer may transmit data to the communicating party at a desired baud rate without regard to the operating frequency of the microcomputer.

It is another object of the invention to provide a microcomputer capable of updating data in the flash memory incorporated therein in accordance with the user-designated operating frequency of the microcomputer.

Other objects, features and advantages of the present invention will become apparent in the following specification and accompanying drawings.

The major features of what is disclosed in this application are outlined as follows:

The microcomputer embodying the invention comprises on a single semiconductor chip at least a central processing unit (CPU) and a nonvolatile flash memory to and from which the data to be processed by the CPU may be written and erased electrically. The microcomputer provides an operation mode in which to update data in the flash memory using the serial communication interface, the baud rate of the serial communication interface being adjusted automatically with respect to the baud rate of the host computer.

In the operation mode above, the CPU controls the updating of data in the flash memory and serial communication operations. The program for controlling the CPU is held in the flash memory or in a mask ROM.

The program for controlling the CPU includes a measuring process in which the CPU measures the "Low" or "High" period of serial data sent from the communicating party; a calculating process in which to calculate the baud rate of the communicating party based on the Low or High period so measured; a setting process in which to set the baud rate so calculated into a register of the serial communication interface; and a receiving process in which to receive programs and data from the communicating party.

As mentioned, the program for controlling the CPU is held in the flash memory or in the mask ROM. Resetting the operation mode executes this control program. The area holding the control program in the memory is not selected if any instruction is fetched from somewhere other than this area.

Activating the above operation mode triggers verification of the data in flash memory areas other than the area holding the control program. In the verifying process, if there is found to exist already-written data outside the area holding control program, these data areas outside the control program area are erased.

With the microcomputer of the invention, the program for controlling the CPU includes the measuring, calculating, setting and receiving processes. The control program offering these processes is activated by resetting the operation mode in which to update data in the flash memory. The control program then measures the "Low" or "High" period of serial data from the communicating party, calculates the baud rate of the communicating party based on the Low or High period so measured, and sets automatically the baud rate so calculated into a register of the serial communication interface. Upon reception, the microcomputer receives programs or data from the communicating party at the baud rate thus calculated without regard to the operating frequency of the microcomputer.

That is, when the microcomputer communicates with an externally furnished host computer (i.e., the communicating party), the microcomputer first measures the Low or High period of data sent from the host computer, calculates the baud rate of the host computer from the period so measured, and sets the calculated baud rate value in a baud rate register of the internal serial communication interface. This allows the microcomputer to communicate with the external host computer at the same baud rate.

The control program is stored in a part of a flash memory or in a mask ROM. The control program so stored is readily executed by setting appropriate terminals for the operation mode in which to update data in the flash memory using the serial communication interface.

If an instruction is fetched from somewhere outside the control program holding area, that area is not selected. If any data has been written outside the control program holding area, all data outside that area is erased. In this manner, the data in the flash memory is protected and secured.

For the erase operation, it is possible to set a suitable memory erasure time based on the calculated bit rate and regardless of the operating frequency of the microcomputer, the erasure time being such as not to let the flash memory be erased more than is required.

With the microcomputer remaining installed in its system, data may be received from the communicating party by serial communication at any baud rate and regardless of the operating frequency of the microcomputer, whereby the content of the flash memory inside the microcomputer is updated easily.

BRIEF DESCRIPTION OF THE DRAWINGS

FIG. 5 is a view illustrating a measuring process in which the embodiment measures the Low period of data from the host computer, and a calculating process in which the embodiment calculates the baud rate of the host computer based on the Low period so measured;

FIG. 8 is a view comprising lists of typical voltage conditions for writing and erasing data to and from memory cells;

DESCRIPTION OF THE PREFERRED EMBODIMENTS

Figure 1:
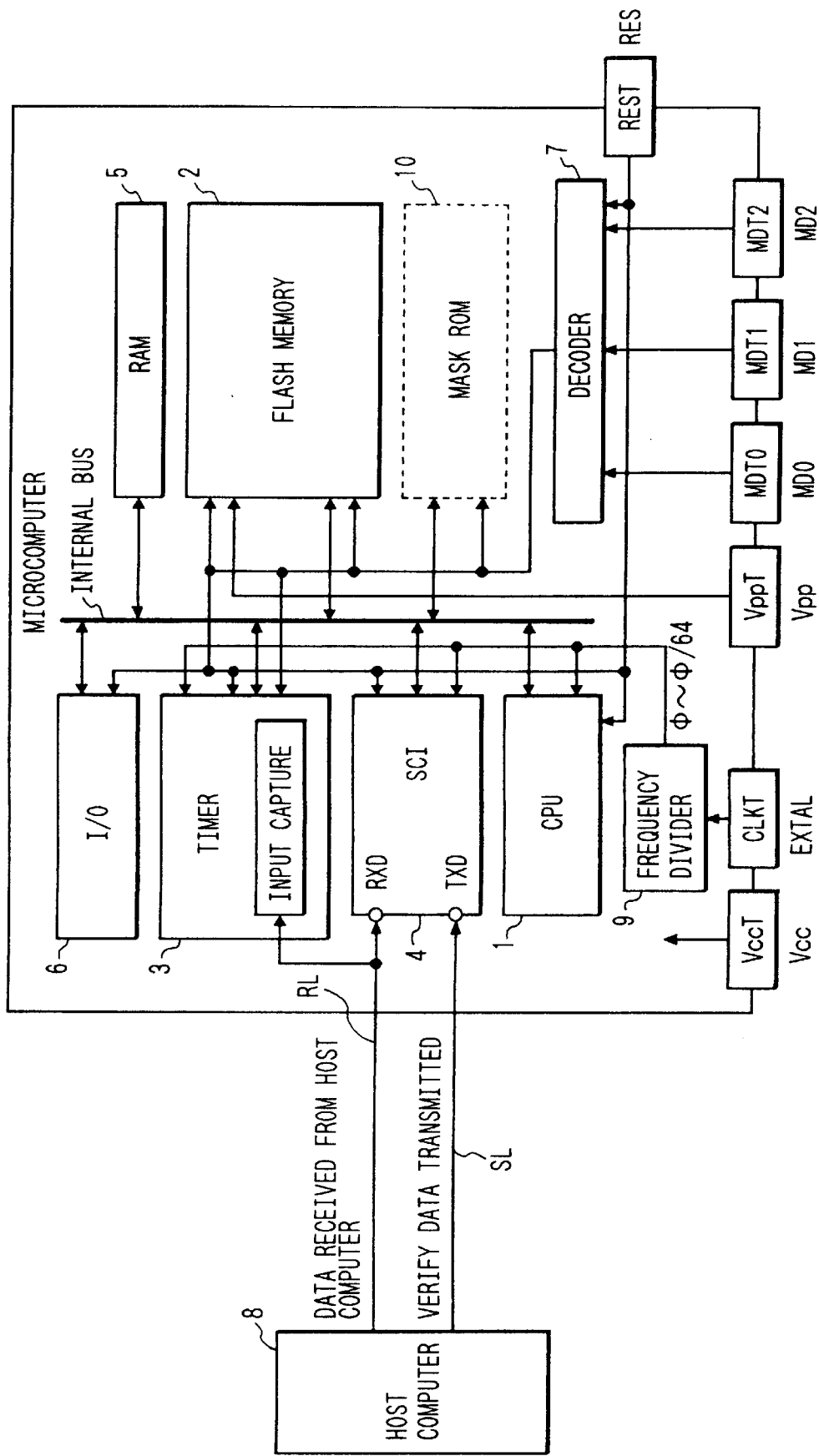
FIG. 1 is a block diagram of a microcomputer embodying the invention, the microcomputer communicating with an externally located host computer through a serial communication interface.

The structure of the microcomputer practiced as one preferred embodiment of the invention will now be described with reference to FIG. 1. The microcomputer 1 has power terminals VccT and VppT as well as a clock terminal CLKT. An operating voltage Vcc of the microcomputer is supplied through the power terminal VccT, and the power terminal VppT is fed with a voltage Vpp ($|Vpp|>Vcc$) for updating flash memory data. The clock terminal CLKT is supplied with a reference clock signal EXTAL illustratively from an external crystal oscillator. The user may decide at his discretion on the frequency of the reference clock signal fed to the clock terminal CLKT.

The microcomputer embodying the invention is illustratively mounted on a single semiconductor chip and furnished with a writable nonvolatile memory to and from which the data to be processed by a CPU may be written and erased electrically. The microcomputer comprises the CPU (central processing unit) 1 connected to an internal bus, a flash memory 2, a timer 3, a serial communication interface (SCI) 4, a random access memory (RAM) 5, an input/output (I/O) unit 6, a decoder 7, and a frequency divider 9. These components are interconnected through an internal bus. The microcomputer is connected illustratively to a host computer 8 such as an externally located personal computer via the serial communication interface 4. The internal bus comprises an internal data bus for transferring data, an internal address bus for transferring address signals, and an internal control bus for transferring control signals between the components.

The CPU 1 controls data exchanges under the direction of a program. In particular, where the operation mode is selected to update data in the flash memory 2 through serial communication with the host computer 8, the CPU 1 controls the update operation on the flash memory 2 as well as the serial communication operations involved.

Figure 2:
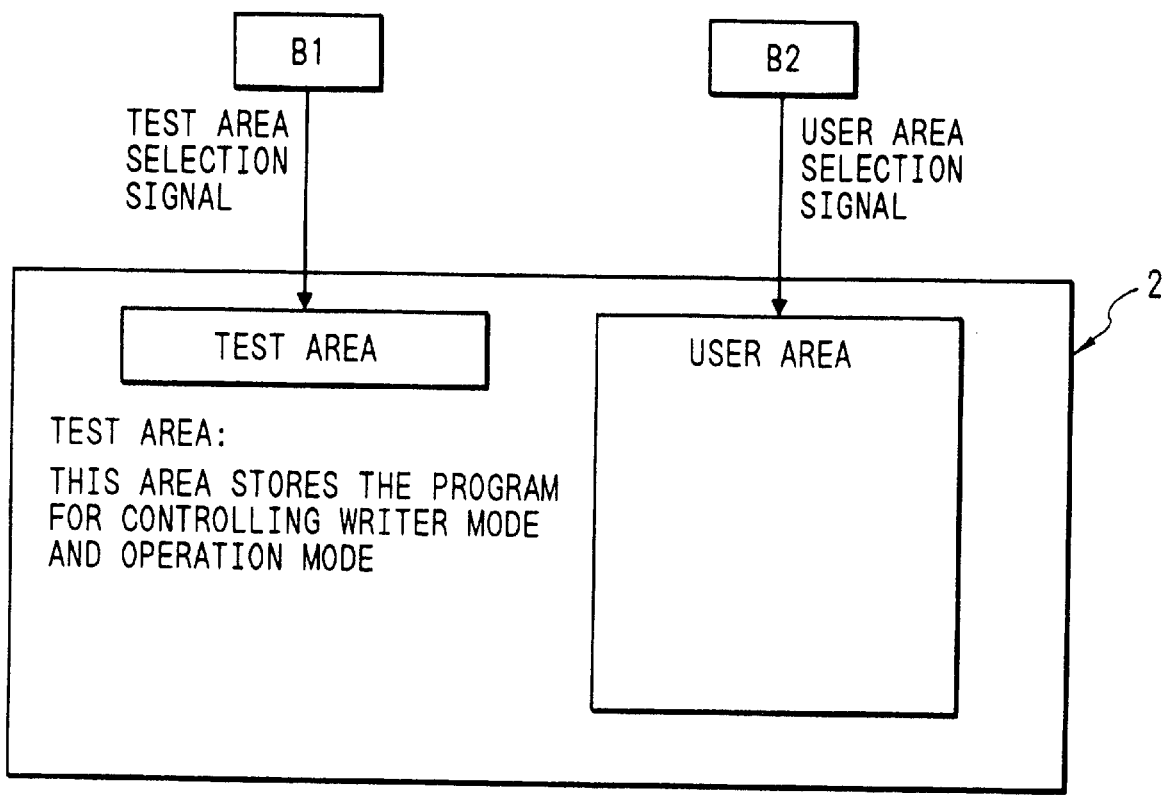
FIG. 2 is a view of a typical memory area structure of an all-area flash memory for use with the embodiment of FIG. 1.

The flash memory 2 is an all-area flash memory to and from which data may be written and erased electrically. As shown in FIG. 2, the flash memory 2 may include a test area accommodating a control program for controlling the CPU 1. With the microcomputer incorporated in its system, the data in the flash memory may be updated under control of the CPU 1 or of an external storage such as a general-purpose PROM writer.

The control pro gram held in the flash memory 2 is started by reset by issuing a reset signal RES from a reset terminal ResT. If the CPU 1 fetches any instruction from outside the area holding the control program, the control program holding area is not selected. If, with the control program started by reset, there is found any data written outside the control program holding area (i.e., written in a user area), then all data outside the test area accommodating the control program is erased.

The timer 3 is illustratively a hardware timer. A receiving terminal RXD of the serial communication interface 4 is assigned an input capture terminal. The input capture function allows the embodiment to measure the Low period of the data coming from the host computer 8.

The serial communication interface 4 interfaces to the externally provided host computer 8 through serial communication. The baud rate of the serial communication interface 4 is set automatically for that of the host computer 8. The data received from the host computer 8 is sent back thereto as verify data through a transmitting terminal TXD over a sending line SL.

The random access memory (RAM) 5 receives data illustratively from the flash memory 2 for temporary storage. The RAM 5 is thus used as a work area or a data buffer area in which to manipulate the received data.

The input/output unit 6 controls data interface to an external device such as a general-purpose ROM writer. The external device is used to write data in the flash memory.

The decoder 7 decodes operation mode signals MD0–MD2 input via mode terminals MDT0–MDT2. For example, the decoder 7 checks to see if the operation mode for data update in the flash memory 2 is designated via the mode terminal MDT0. If the operation mode is found to be designated, the decoder 7 causes the CPU 1 to control the updating of data in the flash memory 2 as well as the serial communication operations involved.

The frequency divider 9 receives the reference clock signal EXTAL through the clock terminal CLKT, and outputs illustratively four internal clock signals of different frequencies, φ, φ/4, φ/16, and φ/64.

The CPU 1 operates in accordance with a given internal clock signal.

Figure 3:
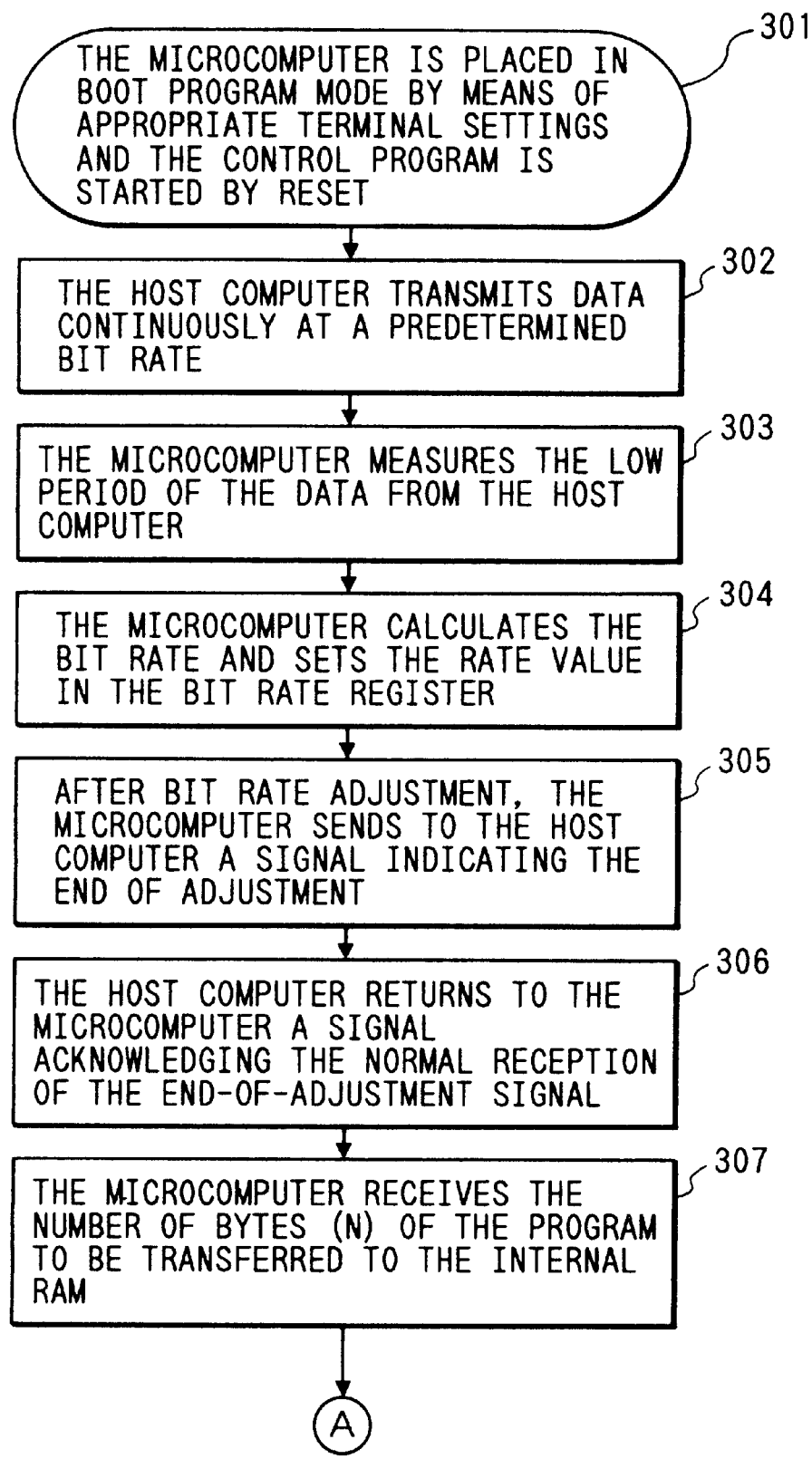
FIG. 3 is a flowchart of steps in which the embodiment uses an operation mode for updating the flash memory.
Figure 4:
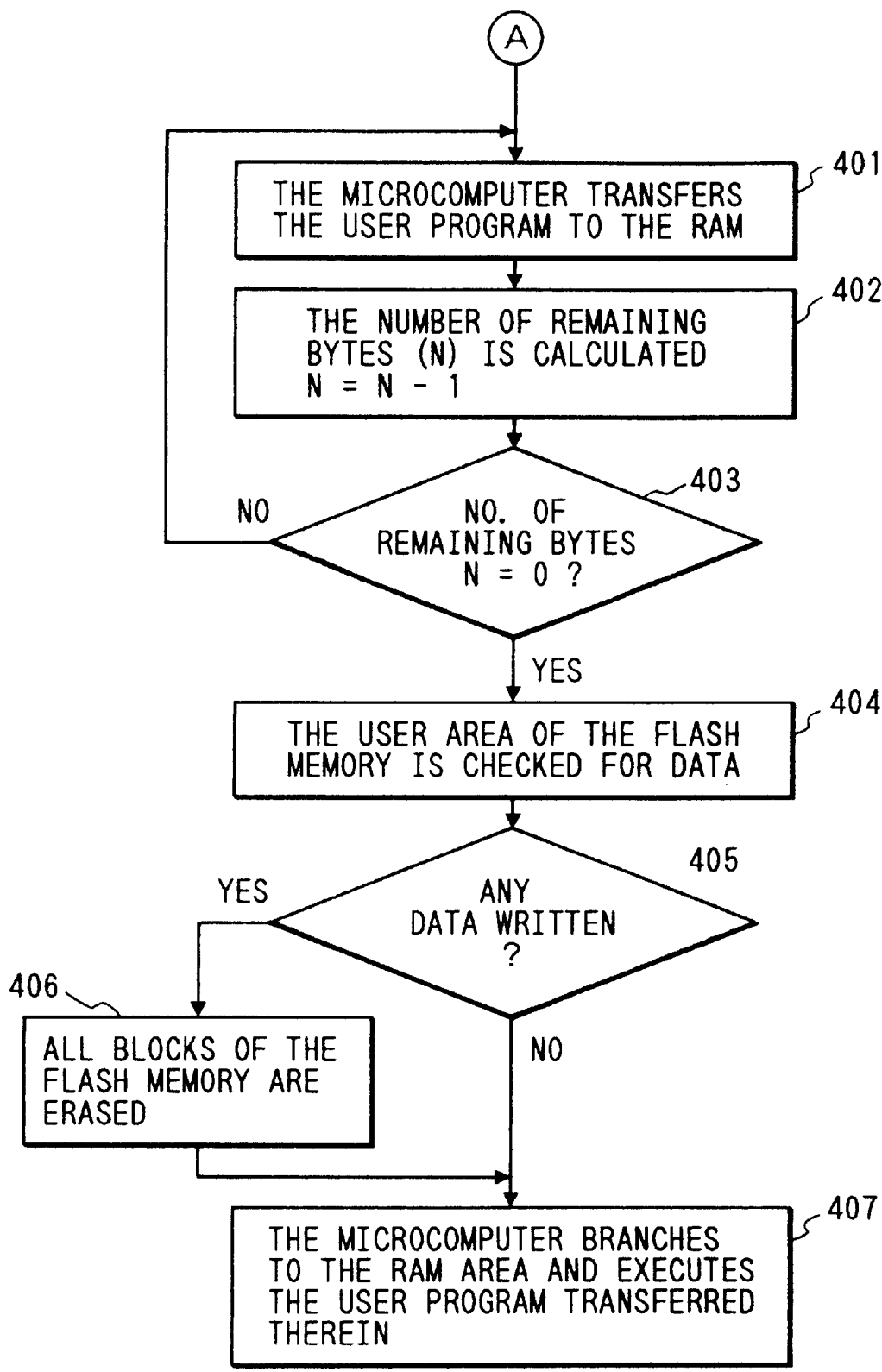
FIG. 4 is a continuation of the flowchart of FIG. 3.

How the embodiment works will now be described with reference to the flowcharts of FIGS. 3 and 4.

The operation mode signals MD0–MD2 are set suitably on their terminals so as to select a boot program mode for the microcomputer. In this state, issuing the instruction for the operation mode with the appropriate terminal settings starts the CPU 1 by reset, which in turn starts the control program in the flash memory 2 (step 301).

With the control program started, the external host computer 8 transmits data continuously at a predetermined bit rate (step 302). The CPU 1 measures the Low period of the data sent from the host computer 8 using the input capture function of the timer 3 and the internal clock signal φ from the frequency divider 9 (step 303; measuring process). In this case, the RXD terminal is assigned the input capture terminal of the timer 3 beforehand.

From the Low period of the data so measured, the CPU 1 calculates the value to be set in the bit rate register (described later) of the serial communication interface 4 (step 304; calculating process). With the bit rate calculated, the CPU 1 sets the result in the bit rate register of the serial communication interface 4 (step 304; setting process).

The measuring and calculating processes are carried out illustratively by resorting to the expressions in FIG. 5. When the Low period corresponding to 9 bits is measured by the input capture function based on the internal clock signal φ, Expression (1) is used to convert the period into time. The result of Expression (1) is put illustratively in Expression (2) that defines the bit rate value for the microcomputer.

When the Low period is converted to time using Expression (1) and the bit rate of the microcomputer is defined by Expression (2), Expression (3) is used to find the bit rate value to be placed in the bit register of the serial communication interface 4.

As outlined, the above calculations using the Low period measurements of the data from the host computer 8 make it possible uniquely to determine the bit rate value, to be placed in the bit rate register, regardless of the operating frequency of the microcomputer or of the baud rate of the data sent from the host computer 8.

When the microcomputer has its baud rate adjusted to the same rate as that of the data from the host computer 8, the microcomputer sends an end-of-adjustment signal to the host computer 8 over the sending line SL (step 305). In turn, the host computer 8 outputs to the microcomputer a signal over the receiving line RL acknowledging the normal reception of the end-of-adjustment signal (step 306).

The host computer 8 then transmits the number of bytes of the user program to be transferred next. Thereafter, the user-designated program is transmitted.

At this point, the microcomputer receives the user program transmitted by the host computer 8 (step 307; receiving process). The received user program is transferred to the RAM 5 (step 401). The CPU 1 then calculates the number of remaining bytes to be transferred (step 402). Steps 401 and 402 are repeated until the transfer of the user program comes to an end (step 403).

Before the transferred user program is executed, a check is made to see if there exists any data written so far in the flash memory 2 (step 404). If data is found to be written (step 405), all memory blocks containing the data are erased (step 406). This ensures data security in the flash memory 2.

If no data is found to be written, the last instruction of the program in the test area of the flash memory 2 is carried out. This causes the microcomputer to branch to the area of the RAM 5 and to execute the user program transferred therein (step 407). The flash memory 2 is updated in this manner.

As described, the microcomputer embodying the invention measures the Low period of the data transmitted from the host computer 8, calculates the bit rate from the Low period so measured, and sets the calculated bit rate value in the bit rate register of the serial communication interface 4. All these operations are carried out automatically. Because the microcomputer communicates with the host computer 8 at the same baud rate as that of the latter whatever that rate is and regardless of the operating frequency of the microcomputer, it is easy to update the content of the flash memory 2.

When data has been written anywhere other than the area holding the control program in the flash memory 2, all data outside the control program holding area is erased. This ensures data security in the flash memory 2.

Figure 11:
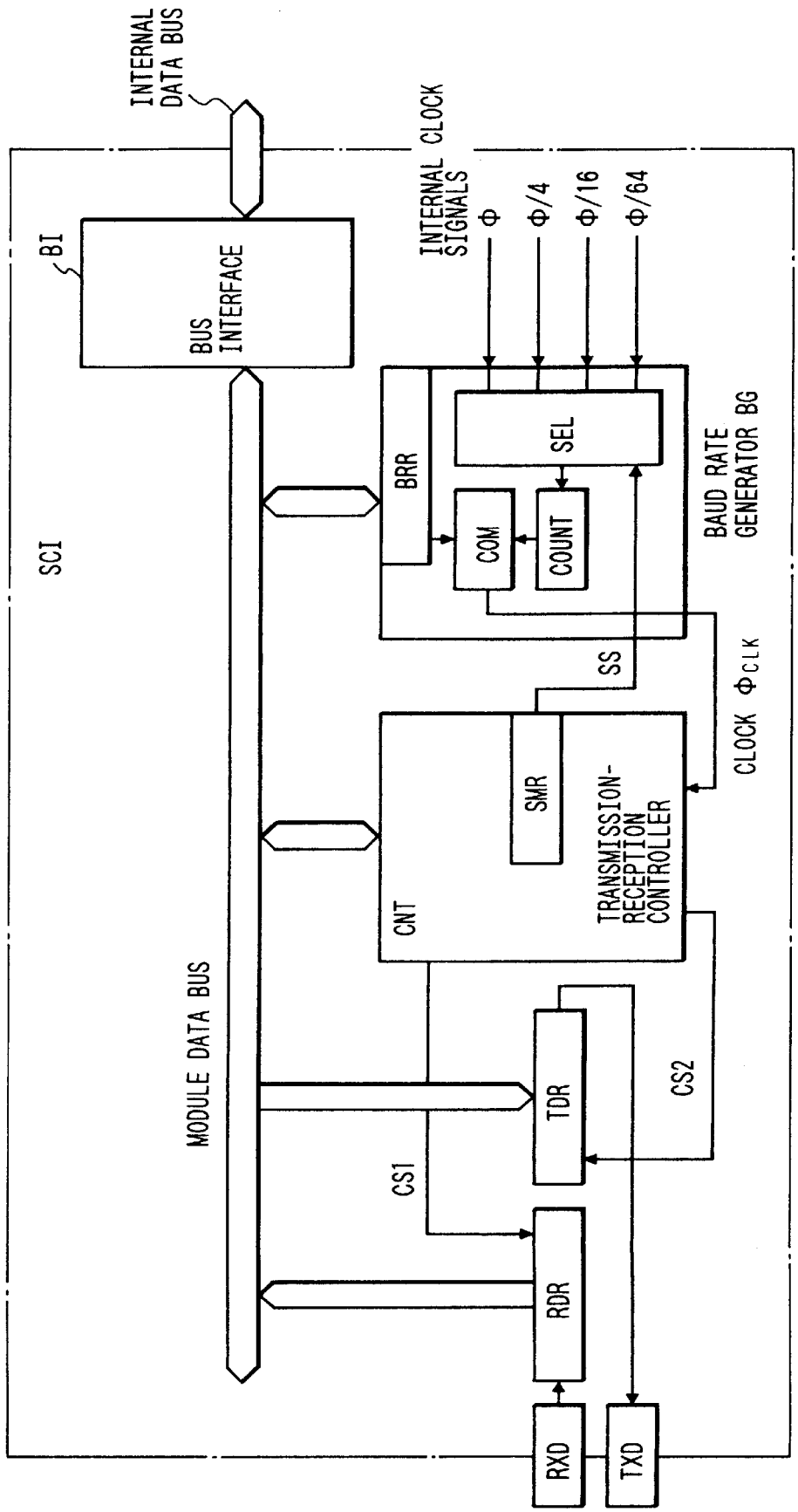
FIG. 11 is a schematic view of what is inside the serial communication interface of the embodiment.
Figure 13:
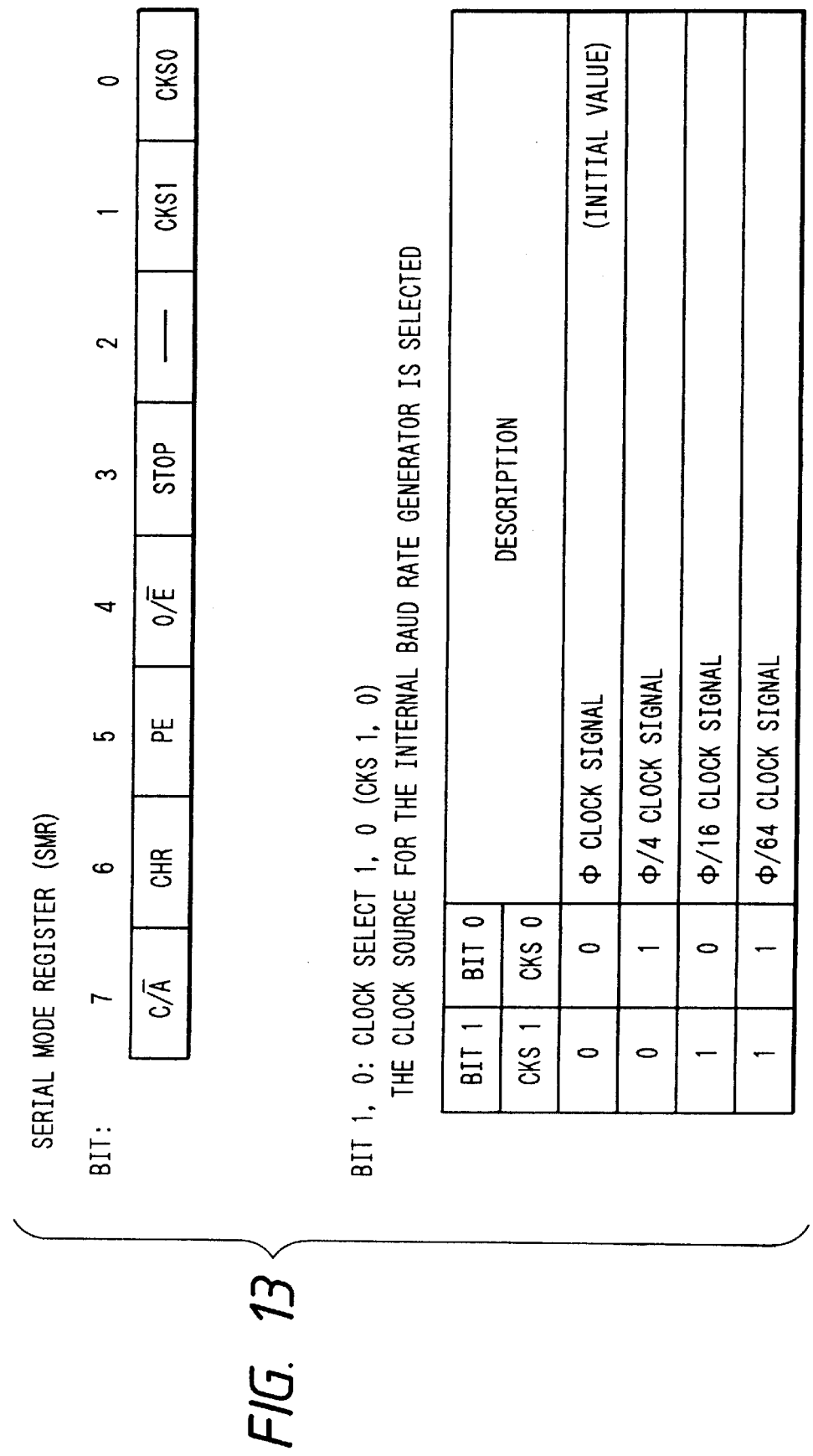
FIG. 13 is a view of a typical serial mode register structure.

FIG. 11 schematically depicts the internal structure of the serial communication interface SCI. The serial communication interface SCI comprises a bus interface BI, a baud rate generator BG, a transmission-reception controller CNT including a serial mode register SMR, a transferred data register TDR, and a received data register RDR. The baud rate generator BG includes a selector SEL that receives the internal clock signals φ–φ/64 and selects one of them, a bit rate register BRR, a comparator COM, and a counter COUNT. The received data register RDR temporarily accommodates serial data coming from the host computer 8. Given a control signal CS1 from the transmission-reception controller CNT, the received data register RDR converts the received serial data into parallel data and outputs the parallel data to the CPU 1 via the bus interface BI. The transferred data register TDR holds temporarily the parallel data sent from the CPU 1 via the bus interface BI, converts the parallel data so held therein into serial data in accordance with a control signal CS2 from the transmission-reception controller CNT, and outputs the serial data to the host computer 8. The serial mode register SMR, as shown in FIG. 13, outputs a selection signal SS for selecting one of the internal clock signals φ–φ/64 depending on the data set in bits 0 and 1. The data to be set in bits 0 and 1 is provided by the CPU 1. Given the selection signal SS from the serial mode register SMR, the selector SEL in the baud rate generator BG supplies the counter COUNT with one of the internal clock signals φ–φ/64. The comparator COM compares the value in the bit rate register BRR holding the value obtained by Expression (2) in FIG. 5 with the value counted by the counter COUNT. If the compared values match, the comparator COM supplies the transmission-reception controller CNT illustratively with a clock signal $\phi_{CLK}$ changing from the Low to High level. Given the clock signal $\phi_{CLK}$, the transmission-reception controller CNT controls accordingly the timing for data storage and output to and from the transferred data register TDR and received data register RDR.

Figure 12:
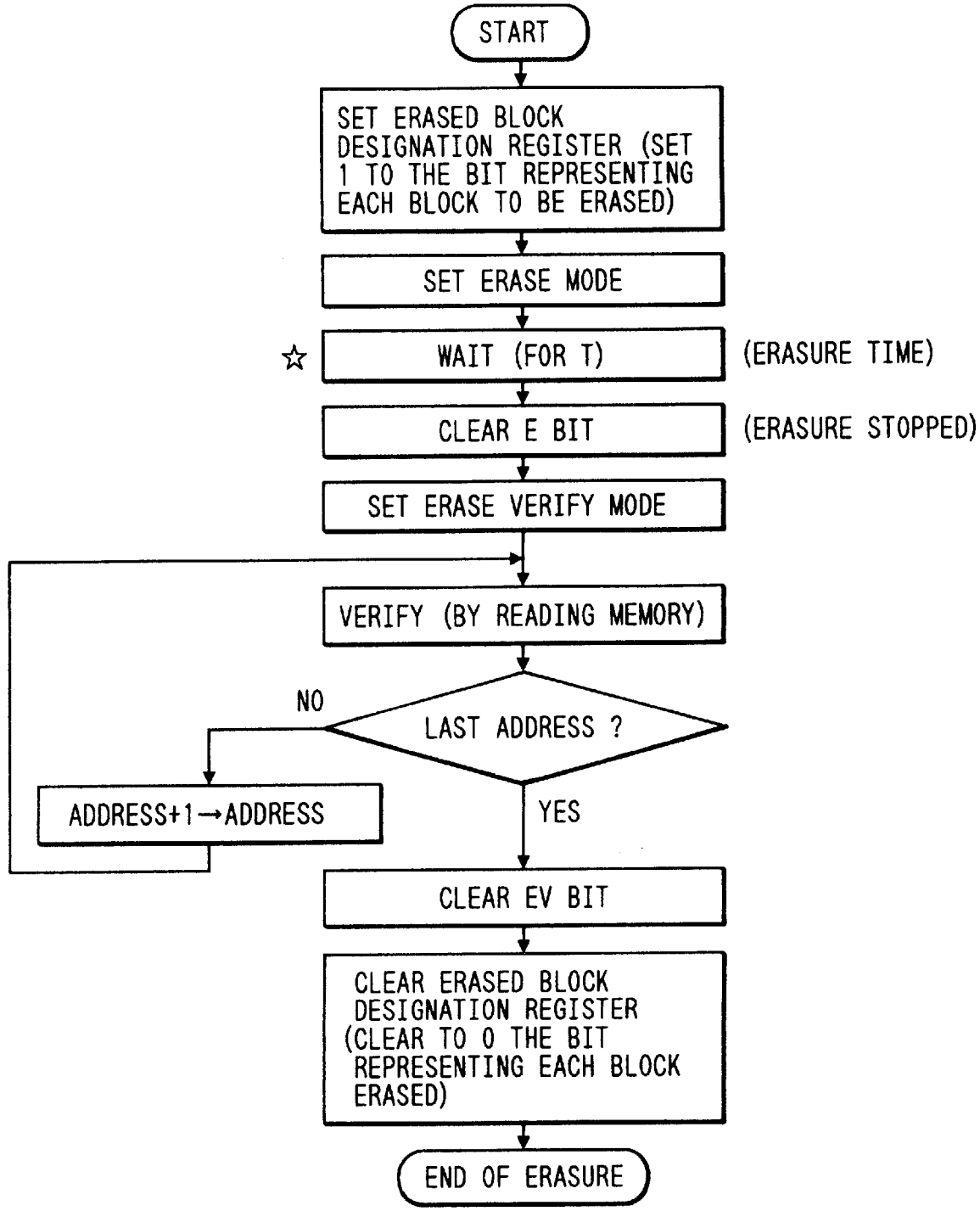
FIG. 12 is a flowchart of steps in which the CPU of the embodiment erases data in the flash memory.

FIG. 12 is a flowchart of steps in which the CPU 1 of the embodiment erases data in the flash memory 2. The CPU 1 first sets an appropriate value in an erased block designation register that designates the blocks to be erased in the flash memory 2. The CPU 1 then sets the E bit in the control register CR of the flash memory 2 to put the flash memory 2 in erase mode. With the erase mode set, the CPU 1 waits for a period of T (erasure time) while a predetermined number of cycles are counted on a software timer. Upon elapse of the period T, the CPU 1 clears the E bit and puts the flash memory 2 out of the erase mode. The CPU 1 then sets the EV bit in the control register CR, puts the flash memory 2 in erase verify mode, and reads the blocks that should have been erased. When all addresses are read and found to be set to "1" each for erasure, the CPU 1 puts the flash memory 2 out of the erase verify mode (by clearing the EV bit), and clears the erased block designation register. This completes the erase operation. As shown in FIG. 6(B), the erasure time T is the time required for memory cells to change from the written state (in high threshold region $V_{thh}$) to the erased state (in low threshold region $V_{thl}$). Although the erasure time T varies depending on the memory cell process techniques utilized, the high threshold region $V_{thh}$ is generally 4.5 V or higher and the low threshold region $V_{thl}$ 2.5 V or lower. It generally takes 10 ms to change from the high threshold region $V_{thh}$ to the low threshold region $V_{thl}$.

Described below with reference to FIG. 5 is how to find the number of cycles counted on the software timer. Expressions (4) and (5) below are used to calculate the time of one cycle.

How to Calculate the Erasure Time

On the basis of a given baud rate (B), the erasure time is calculated as follows:

$$\text{(Time of 1 cycle)} = \frac{\text{(time of Low period)}}{\text{(No. of cycles } X \text{ in Low period)}} \quad (4)$$

$$= \frac{9}{\text{(No. of cycles in Low period)} \times B} \quad (5)$$

Expression (6) below is used to calculate the number of cycles constituting the erasure time. The number of cycles constituting the erasure time is the number of cycles counted on the software timer of the CPU 1. If T denotes the time required to erase the flash memory, the number of cycles in the erasure time is given by Expression (6) below. That is, the erasure time is determined by the bit rate irrespective of the operating frequency involved.

$$\text{(No. of cycles in erasure time)} = \frac{T}{\text{(Time of 1 cycle)}} \quad (6)$$

$$= \frac{T \times \text{(No. of cycles in Low period)} \times B}{9}$$

Figure 6A:
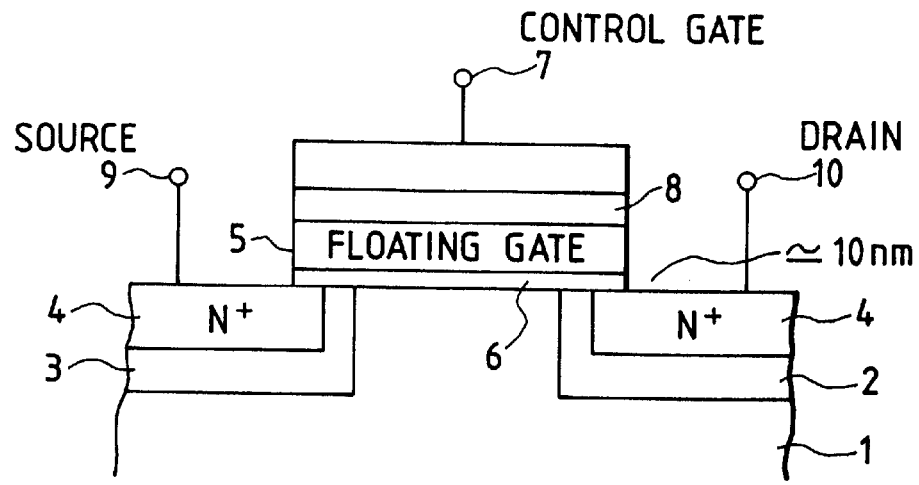
FIG. 6(A) is a cross-sectional view of a flash memory cell in connection with the invention.
Figure 6B:
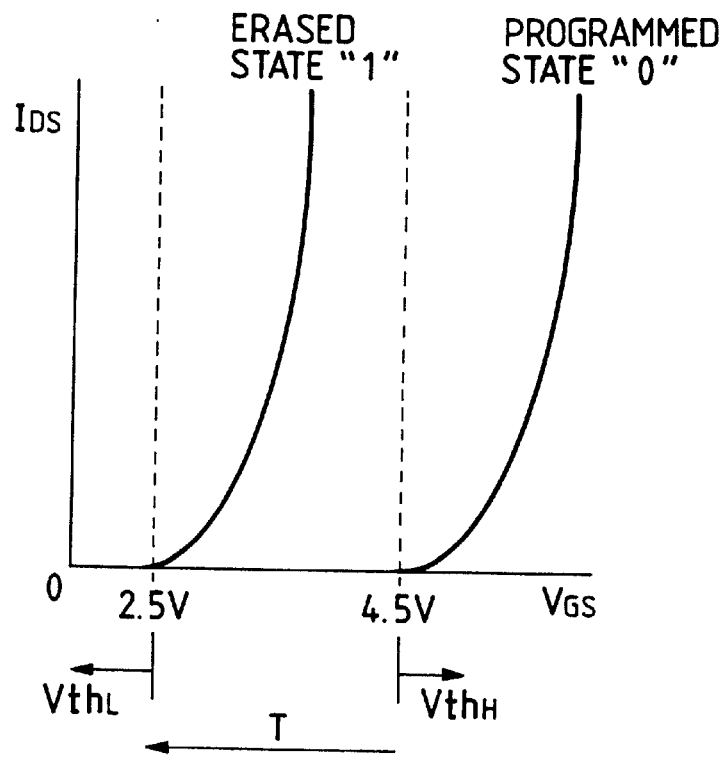
FIG. 6(B) is a graphic representation of a write and an erase state of a flash memory cell.

FIG. 6(A) is a cross-sectional view of a flash memory cell in connection with the invention, and FIG. 6(B) is a graphic representation of the written and the erased state of a flash memory cell. The memory cell shown illustratively in FIG. 6(A) is composed of an insulated gate field effect transistor in a two-layer gate structure. In FIG. 6(A), reference numeral 1 is a P-type silicon substrate; 2 is a P-type diffusion layer formed on the silicon substrate 1; 3 is a low-density N-type diffusion layer formed on the silicon substrate 1; 4 is an N-type diffusion layer formed on the P-type diffusion layer 2 and on the N-type diffusion layer 3; 5 is a floating gate formed on the P-type silicon substrate 1 with a thin oxide film 6 (e.g., 10 nm in thickness) interposed therebetween; 7 is a control gate formed on the floating gate 5 with an oxide film 8 interposed therebetween; 9 is a source; and 10 is a drain. The information stored in this memory cell is in fact held in the transistor as a change in threshold voltage. Unless otherwise noted, the description that follows will deal with an N-channel transistor for storing information (called the storage transistor) in each memory cell.

The writing of information to the memory cell is accomplished illustratively by applying a high voltage to the control gate 7 and drain 10 for avalanche injection of electrons into the floating gate 5 from the side of the drain 10. After the write operation, the threshold voltage of the storage transistor as viewed from the control gate 7 becomes higher than that of the transistor in the erased state, i.e., the storage transistor to which no information has been written, as shown in FIG. 6(B).

The erasure of information from the memory cell is achieved by applying a high voltage to the source 9 for extraction of electrons by the tunnel effect from the control gate 7 toward the source 9. After the erase operation, the threshold voltage of the storage transistor becomes low as viewed from the control gate 7, as depicted in FIG. 6(B). In the example of FIG. 6(B), the threshold of the storage transistor is positive both in the written and in the erased state. That is, the threshold voltage of the written state is made higher than the word line selection level fed from the word line to the control gate; the threshold voltage of the erased state is made lower than the word line selection level. With the two threshold voltages held in their above-described relation to the word line selection level, a memory cell is constituted by a single transistor without the use of a selective transistor arrangement. Electrical erasure of stored information is accomplished by extracting the electrons accumulated in the floating gate toward the source electrode. This means that an erase operation performed for a relatively long time can extract from the floating gate more electrons than those injected thereto at the time of the preceding write operation. Such excess erasure caused by the prolonged electrical erase operation can result in a negative threshold voltage of the storage transistor. The negative threshold level can let the transistor be selected inadvertently even if the word line is at the unselected level. This disadvantage is circumvented by the present invention allowing the CPU to calculate the appropriate erasure time that forestalls the excess erasure. Meanwhile, the write operation may also be accomplished using the tunnel current as in the case of the erase operation.

In a read operation, the voltages applied to the drain 10 and the control gate 7 are limited to relatively low levels so that undesired carriers will not be injected inadvertently into the floating gate 5 of the memory cell. Illustratively, a voltage as low as 1 V is applied to the drain 10 while a voltage of about 5 V is applied to the control gate 7. With such voltages applied, the channel current flowing through the storage transistor is detected and checked for magnitude. This allows the information stored in the memory cell to be judged as "0" or "1".

Figures 7, 10:
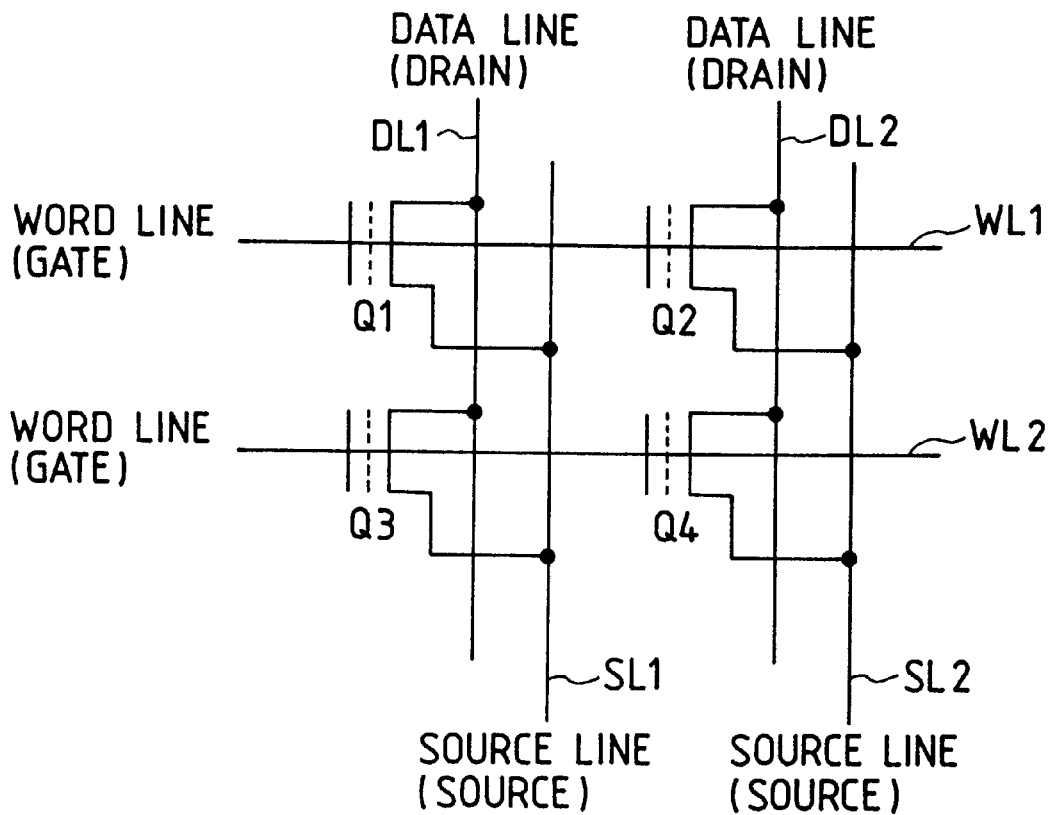
FIG. 7 is a schematic view depicting the structural principle of a memory cell array.
FIG. 10 is a view of a typical control register structure.

FIG. 7 depicts schematically the structural principle of a memory cell array using the storage transistors described above. FIG. 7 includes four typical storage transistors (i.e., memory cells) Q1 through Q4. In the memory cells arranged in a matrix of X and Y directions, the control gates (memory cell selection gates) of the storage transistors Q1 and Q2 (Q3 and Q4) in the same row are connected to a word line WL1 (WL2); the drain regions (i.e., I/O nodes of memory cells) of the storage transistors Q1 and Q3 (Q2 and Q4) in the same column are connected respectively to data lines DL1 and DL2. The source regions of the storage transistors Q1 and Q3 (Q2 and Q4) are connected to a source line SL1 (SL2).

FIG. 8 comprises lists of typical voltage conditions for writing and erasing data to and from memory cells. In FIG. 8, the gate refers to the control gate that acts as a memory cell selection gate. In an erase operation by the negative voltage method noted in FIG. 8, a negative voltage (e.g., −10 V) is applied to the control gate so as to form a high electrical field therein needed to erase information from a given memory cell. As can be seen from the voltage conditions listed, an erase operation based on the positive voltage method may erase collectively all memory cells whose sources are at least connected in common. It follows that in the structure of FIG. 7, connecting the source lines SL1 and SL2 allows the four memory cells Q1 through Q4 to be erased collectively. In that case, the memory block size may be set as desired by varying the number of memory bits coupled to the same source line. In the so-called source line division setup, the smallest memory block regarded as a unit of erasure is equivalent to one data line. On the other hand, an erase operation based on the negative voltage method erases collectively all memory cells whose control gates are at least connected in common.

Use of Multiple Memory Blocks of Different Storage Capacities.

Figure 9:
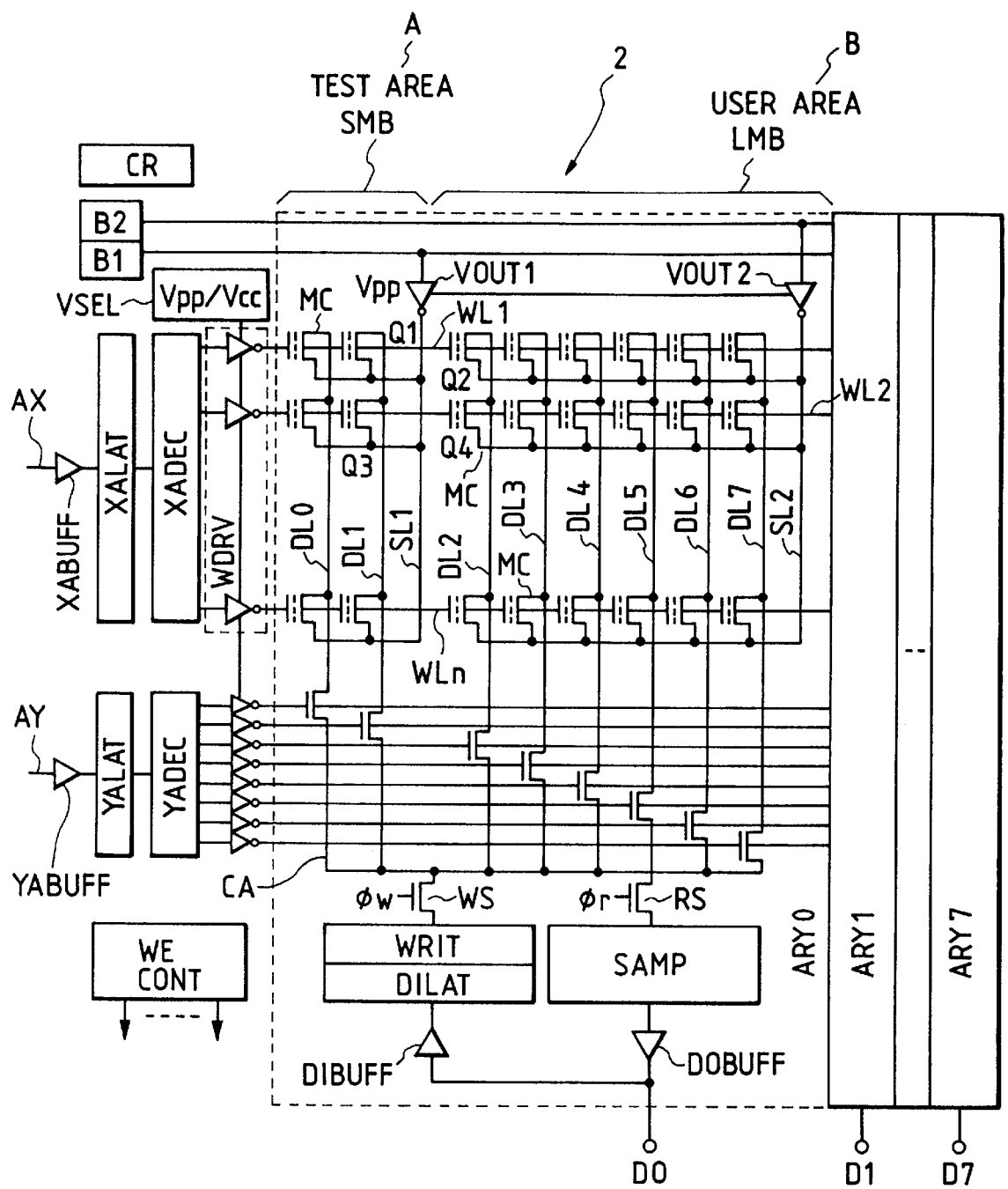
FIG. 9 is a circuit block diagram of a typical flash memory having collectively erasable memory blocks of different storage capacities.

FIG. 9 is a circuit block diagram of a typical flash memory having collectively erasable memory blocks of different storage capacities.

The flash memory 2 in FIG. 9 has eight-bit data I/O terminals D0–D7 that are assigned memory arrays ARY0–ARY7, respectively. The memory arrays ARY0–ARY7 are each divided into a memory block LMB of a relatively large storage capacity and a memory block SMB of a relative small storage capacity. A detailed structure of the memory array ARY0 shown in FIG. 9 also applies to the other memory arrays.

The memory arrays ARY0–ARY7 are each composed of memory cells MC arranged in a matrix, each memory cell being an insulated gate field effect transistor in a two-layer gate structure described with reference to FIG. 6. In FIG. 9, WL0–WLn denote word lines that are common to all memory arrays ARY0–ARY7. The control gates of the memory cells MC in the same row are connected to the corresponding word line. In each of the memory arrays ARY0–ARY7, the drain regions of the memory cells MC in the same column are connected respectively to data lines DL0–DL7. The source regions of the memory cells MC constituting the test area in FIG. 2 (i.e., memory block SMB) are connected commonly to the source line SL1; the source regions of the memory cells MC making up the user area in FIG. 2 (i.e., memory block LMB) are connected commonly to the source line SL2.

Voltage output circuits VOUT1 and VOUT2 supply the source lines SL1 and SL2 with a high voltage Vpp used for erasure. The output operation of the voltage output circuits VOUT1 and VOUT2 is selected by use of the values set in erased block designation registers B1 and B2. For example, a "1" set in the erased block designation register B1 allows only the memory blocks SMB to be erased collectively from the memory arrays ARY0–ARY7; a "1" set in the erased block designation register B2 allows only the memory blocks LMB to be erased collectively from the memory arrays ARY0–ARY7; "1" and "1" set in the erased block designation registers B1 and B2 cause the entire flash memory to be erased collectively.

Selection of the word lines WL0–WLn is accomplished by a row address decoder XADEC decoding a row address signal AX introduced through a row address buffer XABUFF and a row address latch XALAT. A word driver WDRV drives the selected word line in accordance with the selection signal output by the row address decoder XADEC. In a data read operation, the word driver WDRV utilizes as its power supply the ground potential (e.g., 0 V) and the voltage Vcc (e.g., 5 V from a voltage selection circuit VSEL). Specifically, the word driver WDRV drives the word line to be selected up to the selected level using the voltage Vcc while keeping the unselected word lines at the unselected level such as the ground potential. In a data write operation, the word driver WDRV uses as its power supply the ground potential (0 V) and the voltage Vpp (e.g., 12 V from the voltage selection circuit VSEL). That is, the word driver WDRV using the power supply drives the word line to be selected up to the high voltage level of 12 V for write operation. In a data erase operation, the word driver WDRV outputs a low voltage level such as 0 V.

In each of the memory arrays ARY0–ARY7, the data lines DL0–DL7 are connected commonly to a common data line CD via column selection switches YS0–YS7. Switching control over the column selection switches YS0–YS7 is accomplished by a column address decoder YADEC decoding a column address signal AY introduced through a column address buffer YABUFF and a column address latch YALAT. Output selection signals of the column address decoder YADEC are supplied commonly to all memory arrays ARY0–ARY7. When one of the output selection signals from the column address decoder YADEC is brought to the selected level, one data line is connected to the common data line CD in each of the memory arrays ARY0–ARY7.

The data read from the memory cells MC to the common data line CD is fed via a selection switch RS to a sense amplifier SAMP. After amplification by the sense amplifier SAMP, the data is output from a data output buffer DOBUFF. The selection switch RS is brought to the selected level in synchronism with the read operation. Write data supplied externally goes past a data input buffer DIBUFF and is held in a data input latch circuit DILAT. When the data held in the data input latch circuit DILAT is "0", a write circuit WRIT supplies a high voltage for write operation to the common data line CD via the selection switch WS. The high voltage for write operation is sent via the data line selected by the column address signal AY to the drain of the memory cell whose control gate is fed with a high voltage according to the row address signal AX. This writes information to the memory cell in question. The selection switch WS is brought to the selected level in synchronism with the write operation. Various timing signals for write and erase operations as well as voltage selection control signals are generated by an erase control circuit WECONTY.

FIG. 10 shows a typical structure of the typical control register CR. The control register CR is constituted by an eight-bit program/erase control register PEREG. In the program/erase control register PEREG, bit Vpp acts as a high-voltage application flag that is set to "1" so that the high voltage for write operation is applied. Bit E denotes an erase operation when set. Bit EV is used to designate a verify operation upon erasure. Bit P designates a program operation (i.e., write operation), while bit PV serves to specify a verify operation upon program operation.

Although the description above contains many specificities, these should not be construed as limiting the scope of the invention but as merely providing illustrations of the presently preferred embodiment of this invention. Many apparently different embodiments of the present invention may thus be made without departing from the spirit and scope thereof.

For erasure of the flash memory 2, the above embodiment measures the Low period of the data sent from the host computer 8 as described and, using the bit rate calculated from the Low period so obtained, acquires the appropriate number of cycles amounting to the erasure time that forestalls excess erasure of the memory. The appropriate erasure time for the flash memory is set in this manner regardless of the operating frequency of the microcomputer.

There is an alternative to the above-described way in which the embodiment works to have the input capture function of the timer 3 measure the Low period of data coming from the host computer 8. That is, the High period of the data from the host computer 8 may be measured alternatively, the result being used to calculate the bit rate for communicating with the host computer 8 operating at its own baud rate.

Instead of using the hardware timer 3 to measure the Low period, the embodiment may also utilize a software timer function to accomplish the same measurement.

The control program of the above-described embodiment is stored in the flash memory 2 of the all-area structure. Alternatively, a mask read-only memory (mask ROM) 10 may be furnished as indicated by broken line in FIG. 1, the mask ROM accommodating programs and data which need not be updated.

Specifically, the invention is applicable extensively to microcomputers having at least a CPU and a nonvolatile flash memory mounted on a single semiconductor chip, the memory allowing the CPU to write and erase information thereto and therefrom electrically.

The major features of the invention as disclosed herein are recapitulated as follows:

(1) The program for controlling the CPU comprises: the measuring process in which the Low or High period of serial data from the host computer is measured; the calculating process in which the baud rate of the host computer is calculated from the Low or High period so measured; the setting process in which the calculated baud rate is set to the serial communication interface incorporated in the microcomputer; and the receiving process in which programs and data are received from the host computer. This control program is started by resetting the operation mode for updating data in the flash memory, and the appropriate baud rate at which to communicate with the host computer is set automatically, whereby the microcomputer receives programs and data from the host computer at the same baud rate as that of the latter and regardless of the operating frequency of the microcomputer.

(2) If an instruction is fetched from anywhere other than the area holding the control program, the control program holding area is not selected. When a check made on the flash memory regions other than the control program holding area detects any data written in any of these regions, all such regions outside the control program holding area are erased. This ensures data security of the flash memory. Furthermore, the appropriate erasure time of the flash memory may be set for the above erase operation irrespective of the operating frequency of the microcomputer.

(3) The feature (1) above allows the microcomputer, as it is still incorporated in a given system, to utilize the serial communication interface in communicating with the host computer. This makes it easier to update data in the built-in flash memory.

(4) The feature (1) above also allows for multiitem small-lot production, for system-by-system optimization, and for maintenance involving version updates after shipment from the factory.

What is claimed is:

1. A system including a microcomputer, formed on a single chip and having a read only memory storing a program and a serial communication unit which communicates with a computer, the microcomputer comprising:

a clock signal circuit providing a clock signal having a frequency which is set by a user;

a measuring unit which counts a number of cycles of the clock signal in a period specified by reference data transferred to the microcomputer from the computer via the serial communication unit;

a central processing unit, coupled to receive the clock signal from the clock signal circuit, operating in accordance with said clock signal; and a flash memory for storing data, the data being electrically erased during an erase operation which is executed during an erase time, the erase time including a number of cycles of the clock signal calculated by the central processing unit, wherein said central processing unit calculates a time for one cycle of said clock signal, as a function of the period specified by the reference data and the number of cycles counted by said measuring unit, and calculates the number of cycles of said clock signal to be allocated as the erase time as a function of the time for one cycle of the clock signal.

2. The system according to claim 1, wherein said reference data is provided as serial data from said computer and includes a low level and a high level, the period specified by the reference data corresponding to a period including the low level and the high level, and wherein said measuring unit measures a number of cycles of said clock signal corresponding to said period including the low level and the high level.

3. The system according to claim 2, wherein said microcomputer further includes:

a control register having an erasure designation bit that is set to designate the execution of the erase operation, said erasure designation bit being set and cleared by said central processing unit, said flash memory being erased while said erasure designation bit is set.

4. The system according to claim 3, wherein said erasure designation bit is set by the central processing unit in response to a request for said erase operation and is cleared by the central processing unit after the number of cycles allocated as the erase time have occurred after said erasure designation bit is set.

5. The system according to claim 4, wherein said flash memory includes a plurality of blocks for storing the data, and wherein said microcomputer includes block designation resisters each having a block erasure designation bit, set by the central processing unit, for designating blocks associated with the block designation register to be erased.

6. The system according to claim 5, wherein said data stored in a block of said flash memory is erased if said block erasure designation bit of the associated block designation register is set.

7. The system according to claim 6, wherein said flash memory includes the read only memory, and wherein the flash memory includes a first block for storing said data and a second block for storing said program in the read only memory.

8. The system according to claim 2, wherein the period including the low level and the high level is a fixed time.

9. A method for calculating an erasure time for data stored in a flash memory included in a microcomputer, which is included in a system having a host computer coupled to the microcomputer via a serial communication interface, the microcomputer including a central processing unit, a serial communication unit, and a read only memory for storing a program, the method comprising the steps of:

(1) measuring a number of cycles of a clock signal in a period specified by reference data which is transferred to the serial communication unit from the computer, by a measuring device in said microcomputer, a frequency of the clock signal being set by a user;

(2) calculating a time of one cycle of said clock signal from said period specified by the reference data and the number of cycles obtained by said measuring unit; and (3) calculating a number of cycles of said clock signal to be allocated as an erase time of data stored in said flash memory.

10. The method according to claim 9, wherein the period specified by the reference data is a fixed time.

* * * * *